United States Patent [19]

Lee, Jr.

[11] Patent Number: 5,546,318

[45] Date of Patent: Aug. 13, 1996

[54] METHOD OF GENERATING ELECTRICAL ENERGY METERING QUANTITIES IN A MULTI-CHANNEL LOAD PROFILE RECORDER

[75] Inventor: Robert E. Lee, Jr., Ocala, Fla.

[73] Assignee: General Electric Company, New York, N.Y.

[21] Appl. No.: 357,583

[22] Filed: Dec. 16, 1994

[51] Int. Cl.$^6$ .................................................. G01R 11/54
[52] U.S. Cl. ...................... 364/483; 364/481; 340/870.02
[58] Field of Search ...................................... 364/480–483, 364/492; 340/870.02; 324/113, 114, 116, 103 R, 74, 130, 142, 141

[56] References Cited

U.S. PATENT DOCUMENTS

| | | | |
|---|---|---|---|
| 4,701,698 | 10/1987 | Karlsson et al. | 324/116 |
| 4,792,677 | 12/1988 | Edwards et al. | 340/870.29 |
| 5,122,735 | 6/1992 | Porter et al. | 324/103 R |
| 5,289,115 | 2/1994 | Germer et al. | 324/116 |
| 5,315,235 | 5/1994 | Atherton et al. | 324/116 |
| 5,428,351 | 6/1995 | Lee, Jr. et al. | 340/870.02 |

OTHER PUBLICATIONS

GE Bulletin GEA–11969, *The Phase3 Electronic Polyphase Meter*, Feb. 1991.
A. W. Leigh, *A Simple Real–Time Operating System, Real Time Software for Small Systems*, Sigma Press, 1988, pp. 59–81.
GE Bulletin GEA–11675A, *Expanding the Limits of Interval Demand Recording*, 1988.
GE Bulletin GEA 11753, *The General Electric Universal Reader*, 1987.
GE Bulletin GEA–11700, *Today's Most Advanced Electronic Metering System*, Dec. 1986.
GE Bulletin GEA–11603, *The TM–91 TOU Self–Reading Register*, Dec. 1985.

*Primary Examiner*—Emanuel T. Voeltz
*Assistant Examiner*—Hal D. Wachsman
*Attorney, Agent, or Firm*—Bell, Seltzer, Park & Gibson

[57] ABSTRACT

A method of generating electrical energy metering quantities in a multi-channel load profile recorder includes the steps of sensing a line quantity such as a line current and/or a line voltage, during a load profile time interval. Non-derived electrical energy metering quantities such as watt-hours, var-hours, volt$^2$-hours, ampere$^2$-hours, etc., are then generated upon completion of the load profile time interval. The non-derived quantities are determined from the sensed line quantities and are preferably stored in non-volatile programmable read-only memory (PROM) in the recorder. These steps are then repeated for each of the subsequent consecutive time intervals so that a load profile record or "database" of non-derived metering quantities can be established in the memory. This record can then be retrieved on a periodic basis by a utility field operator, preferably using a hand-held or portable programming unit such as a computer. At the time of retrieval, the internal load profile record is supplemented by the generation and transfer of derived electrical energy metering quantities, such as volt-ampere-hours (VAh) and power factor (PF). These derived quantities are determined from the respective non-derived electrical energy metering quantities, for each of the recorded load profile time intervals. The generation and transfer of the derived electrical energy metering quantities preferably takes place at the time the non-derived quantities are downloaded from internal memory and transferred to the programming unit.

18 Claims, 3 Drawing Sheets

5,546,318

METHOD OF GENERATING ELECTRICAL ENERGY METERING QUANTITIES IN A MULTI-CHANNEL LOAD PROFILE RECORDER

CROSS REFERENCE TO RELATED APPLICATIONS

This application is related to U.S. application Ser. No. 08/357,600 entitled A PROGRAMMABLE MULTI-CHANNEL LOAD PROFILE RECORDER AND METHOD OF RECORDING ELECTRICAL ENERGY METERING QUANTITIES THEREIN, filed concurrently herewith, the disclosure of which is hereby incorporated herein by reference.

FIELD OF THE INVENTION

The present invention relates to electrical energy usage, and more particularly to methods of recording electrical energy usage.

BACKGROUND OF THE INVENTION

In the distribution of electrical energy, electric utility companies have typically found it desirable to measure not only real load energy as watthours delivered to a user, but also, reactive load quadergy as varhours (or reactive volt-ampere hours), apparent energy and power factor. By measuring both watthours and varhours, electric utilities can more accurately apportion the costs of supplying energy to customers having varying demands and loads.

Furthermore, because the capacity of the distribution network for delivering electrical energy to consumers is a function of the apparent energy as volt-ampere-hours and not just the real or reactive components thereof, electric utility companies typically desired that electrical energy meters simultaneously maintain time-based records of apparent energy, power factor and other "derived" load profile metering quantities, in addition to watthour and varhour usage.

These records are typically generated internal to the meter, at the periodic completion of consecutive load profile time intervals. An example of a meter with record keeping capability is the Phase 3i™ Electronic Meter with KRC-901™ Recording Register, which is publicly available from General Electric Company, Somersworth, N.H. Dedicated recording registers having up to 32K bytes of memory for retaining multiple channels of load profile data are also publicly available. For example, the General Electric TMR-900i™ Recording Register can compile up to fifty-four (54) days of data at five (5) minute intervals.

The amount of internal memory needed to record interval data is a function of the product of the number of channels and the number of intervals being recorded and the number of required data bytes per channel. Accordingly, the memory requirements can become exorbitant as the number of channels increases and/or the number of intervals increases. These large memory requirements can also increase the cost of the meter or dedicated recording register. Thus, notwithstanding the fact that the above described meters and dedicated recorders are capable of accumulating load profile data for a plurality of channels and for extended periods of time, there continues to be a need for a multi-channel load profile recorder which reduces the amount of memory space needed for the retaining electrical energy metering quantities, so that additional channels and intervals can be recorded.

SUMMARY OF THE INVENTION

It is therefore an object of the present invention to provide an efficient method of generating electrical energy metering quantities in a multi-channel load profile recorder.

It is another object of the present invention to provide a method of generating electrical energy metering quantities in a multi-channel load profile recorder which does not require the allocation of memory space for each of the generated electrical energy metering quantities.

These and other objects, features and advantages are provided, according to the present invention, by an efficient method of generating electrical energy metering quantities in a multi-channel load profile recorder. This method comprises the steps of generating at least one non-derived electrical energy metering quantity such as watt-hours (Wh) upon completion of a first load profile time interval and then storing this quantity in an internal memory portion of the multi-channel load profile recorder. Then, after many consecutive load profile time intervals have elapsed, the non-derived electrical energy metering quantity is downloaded from the internal memory and transferred to an external storage unit such as a hand-held programming unit. Contemporaneously with this transferring step, a derived electrical energy metering quantity such as volt-ampere hours (VAh) is generated internal to the load profile recorder and then transferred to the external storage unit. This derived electrical energy metering quantity also corresponds to the first load profile time interval and is determined from the respective non-derived quantity. Alternatively, this derived quantity may be generated externally by the hand-held programming unit once the non-derived quantity has been transferred.

In particular, the method comprises the steps of sensing a line quantity such as a line current and/or a line voltage, during a first load profile time interval. Non-derived electrical energy metering quantities such as watt-hours, var-hours, volt$^2$-hours, ampere$^2$-hours, etc., are then generated upon completion of the first load profile time interval, such as during the next (i.e., second) or subsequent load profile time intervals. The non-derived quantities are determined from the sensed line quantities and are preferably stored in non-volatile programmable read-only memory (PROM) in the recorder.

These steps are then repeated for the second and subsequent time intervals so that a load profile record or "database" of non-derived metering quantities can be established in the memory and then subsequently retrieved on a periodic basis by a utility field operator, preferably using a hand-held or portable programming unit such as a computer. At the time of retrieval, the internal load profile record is preferably supplemented by the generation and transfer of derived electrical energy metering quantities, such as volt-ampere-hours (Vah) and power factor (PF). These derived quantities are determined from (i.e., based on) the respective non-derived electrical energy metering quantities, for each recorded load profile time interval.

According to a preferred aspect of the present invention, the generation and transfer of the derived electrical energy metering quantities takes place at the time the non-derived quantities are downloaded from internal memory and transferred. These quantities are preferably not stored in non-volatile internal memory, but may be temporarily stored in random-access memory until all the derived quantities have been generated. Thus, a preferred multi-channel load profile recorder can generate a relatively large record of both non-derived and derived channels of electrical energy metering quantities, even though internal memory is sufficient to store only the non-derived quantities. Periodic retrieval of the load profile record by a utility operator can also be less frequent because a greater number of load profile intervals can be recorded before the memory capacity of the recorder is reached.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
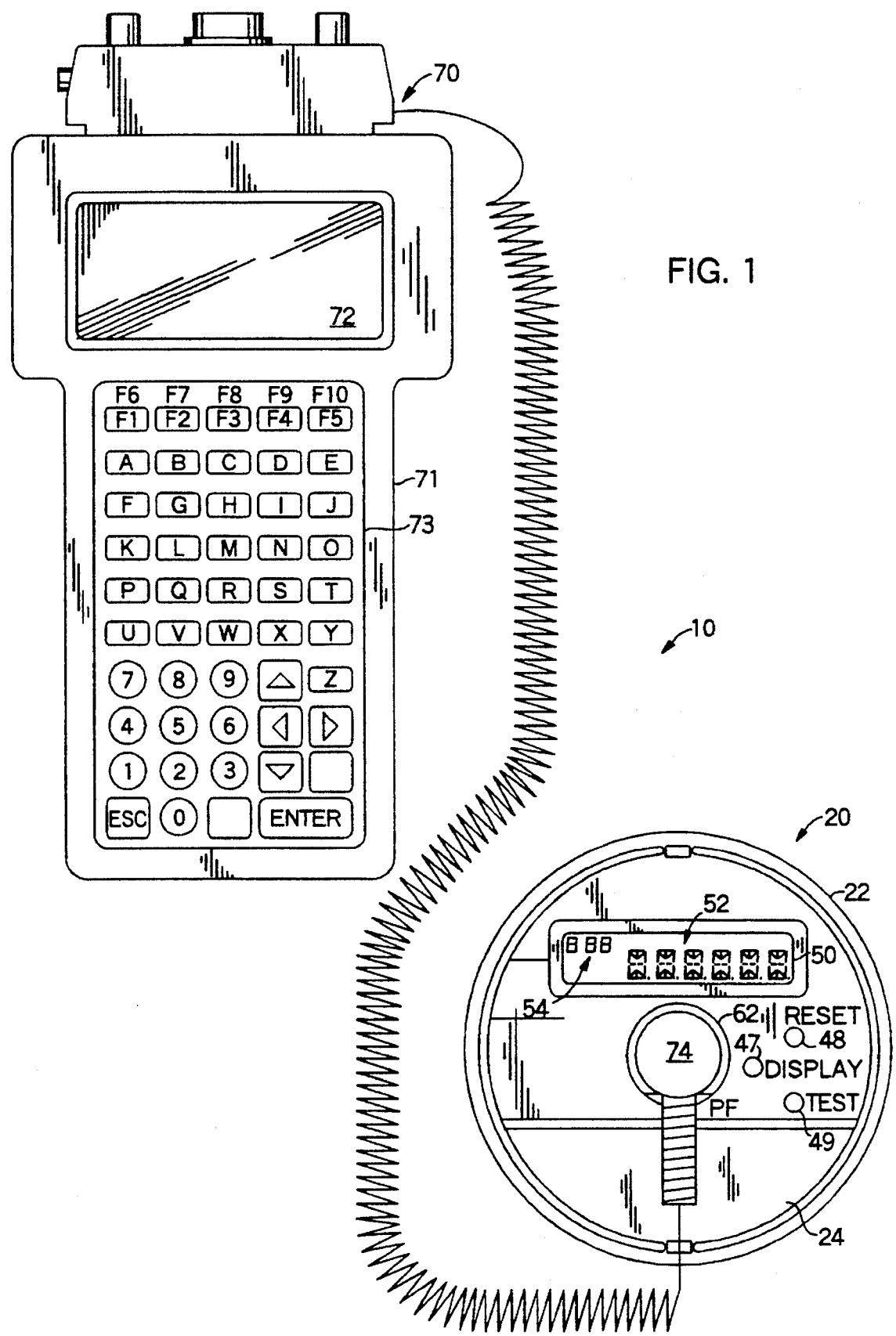
FIG. 1 is a front view of an electrical energy recording system containing a programmable multi-channel load profile recorder according to the present invention.
Figure 2:
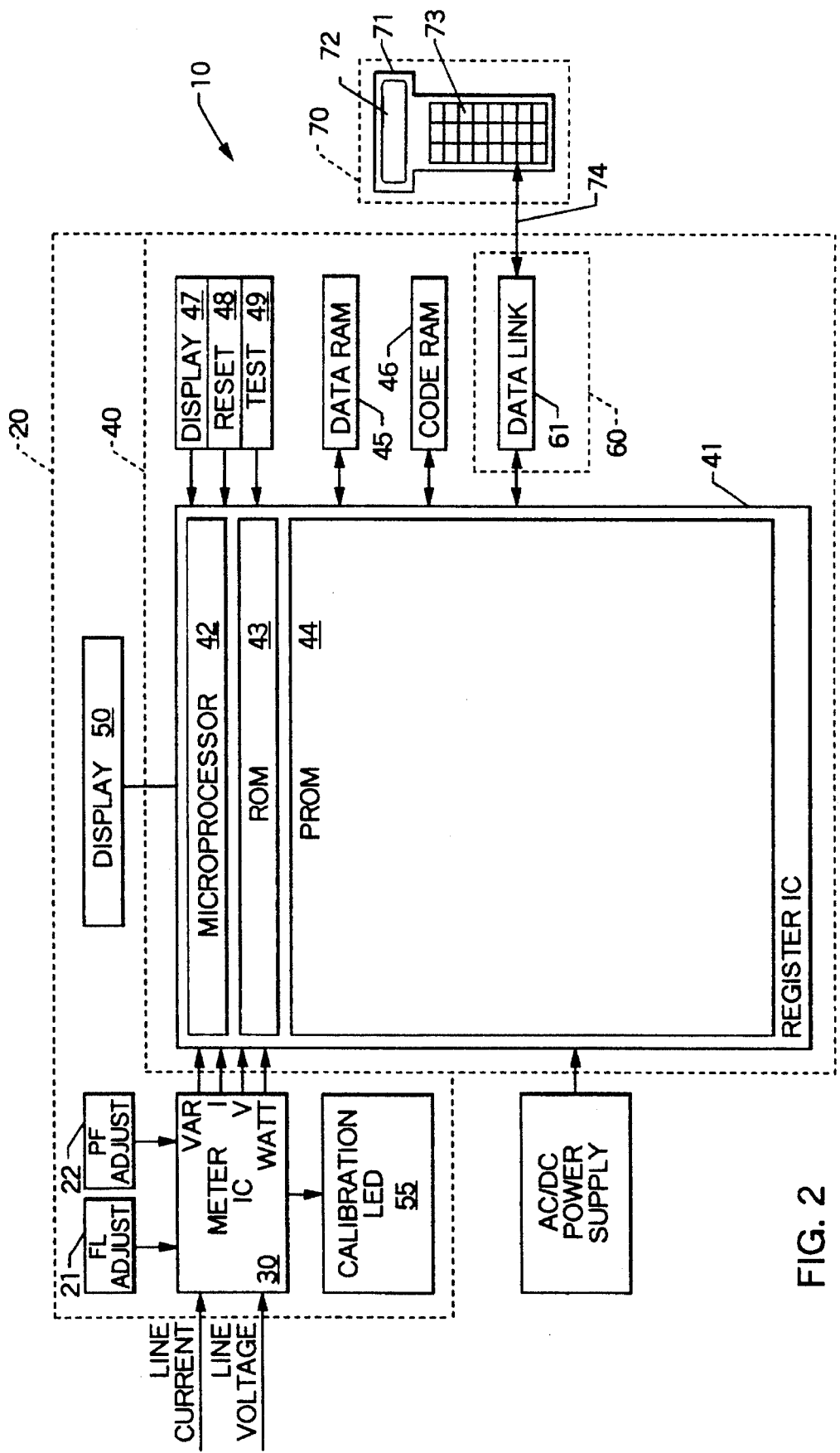
FIG. 2 is an electrical schematic representation of the recording system of FIG. 1.

Referring now to FIGS. 1–2, an electrical energy data recording system 10 is illustrated. The recording system 10 preferably includes an electrical energy meter 20 having a protective housing 22 (e.g. glass) and a meter integrated circuit 30 therein for sensing a line current and a line voltage and generating a plurality of meter output signals (e.g., I, V, Watt and Var) based on the sensed line current and the sensed line voltage. A programmable multi-channel load profile recorder 40, which is electrically connected to the meter integrated circuit 30, is also provided for, among other things, generating multiple channels of electrical energy metering quantities such as watt-hours (Wh), var-hours (Varh), volt$^2$-hours (V$^2$h), ampere$^2$-hours (I$^2$h), volt-ampere-hours (VAh) and power factor (PF). A display 50 preferably comprises a multi-segment liquid crystal alphanumeric display (LCD) at a face 24 of the meter 20, as illustrated. The liquid crystal display 50 can include a six character alphanumeric field 52, three digit numeric field 54, and annunciator segments and pulse and direction indicators (not shown).

The multi-channel load profile recorder 40 is preferably solid-state and includes a register integrated circuit 41 such as an application specific integrated circuit (ASIC). The recorder 40 also preferably includes data random-access memory 45 and code random-access memory 46 (RAM) for data storage and program memory, respectively. Display, reset and test switches 47–49, are also provided at the face 24 of the meter 20, as illustrated. The function of these switches is more fully described in copending and commonly assigned application Ser. No. 08/273,860, now U.S. Pat. No. 5,495,167, entitled "*Electrical Energy Meter Having Record of Meter Calibration Data Therein And Method of Recording Calibration Data*", the disclosure of which is hereby incorporated herein by reference.

As will be understood by those skilled in the art, the ASIC 41 includes circuits for performing the metering quantity generating functions, display control functions, A/D conversion functions, non-volatile memory functions, etc. As illustrated, the ASIC 41 can include a microprocessor portion 42, a read-only memory (ROM) portion 43 and a non-volatile programmable read-only memory (PROM) portion 44. The PROM 44 is preferably formatted to retain a database of the electrical energy metering quantities.

A hand-held programming unit 70 is also provided for programming the recording register 40 and retrieving, among other things, the electrical energy metering quantities contained therein. The programming unit preferably includes a display 72, a data entry keypad 73 for entering data into the meter 20 and an optical/electrical data probe 74. The programming unit 70 is operatively connected to the ASIC 41 by interfacing means 60 which may include a serial data link 61 or may include an RF transceiver for transmitting and receiving radio-frequency signals to and from a remote source. Interfacing means 60 may also include a transceiver for transmitting and receiving informational carrier signals to and from a power line.

A preferred serial data link is an optical "OPTOCOM™" link, marketed by General Electric Company, Meter Division, Somersworth, N.H., although other serial data links such as a modulator/demodulator "modem" (connected to a telephone line or coaxial cable) may also be used. A communications port 62, such as an optical communications port, can also be provided at a face of the meter housing 22. Thus, interfacing means 60 is connected between the port 62 and the ASIC 41.

Figure 3:
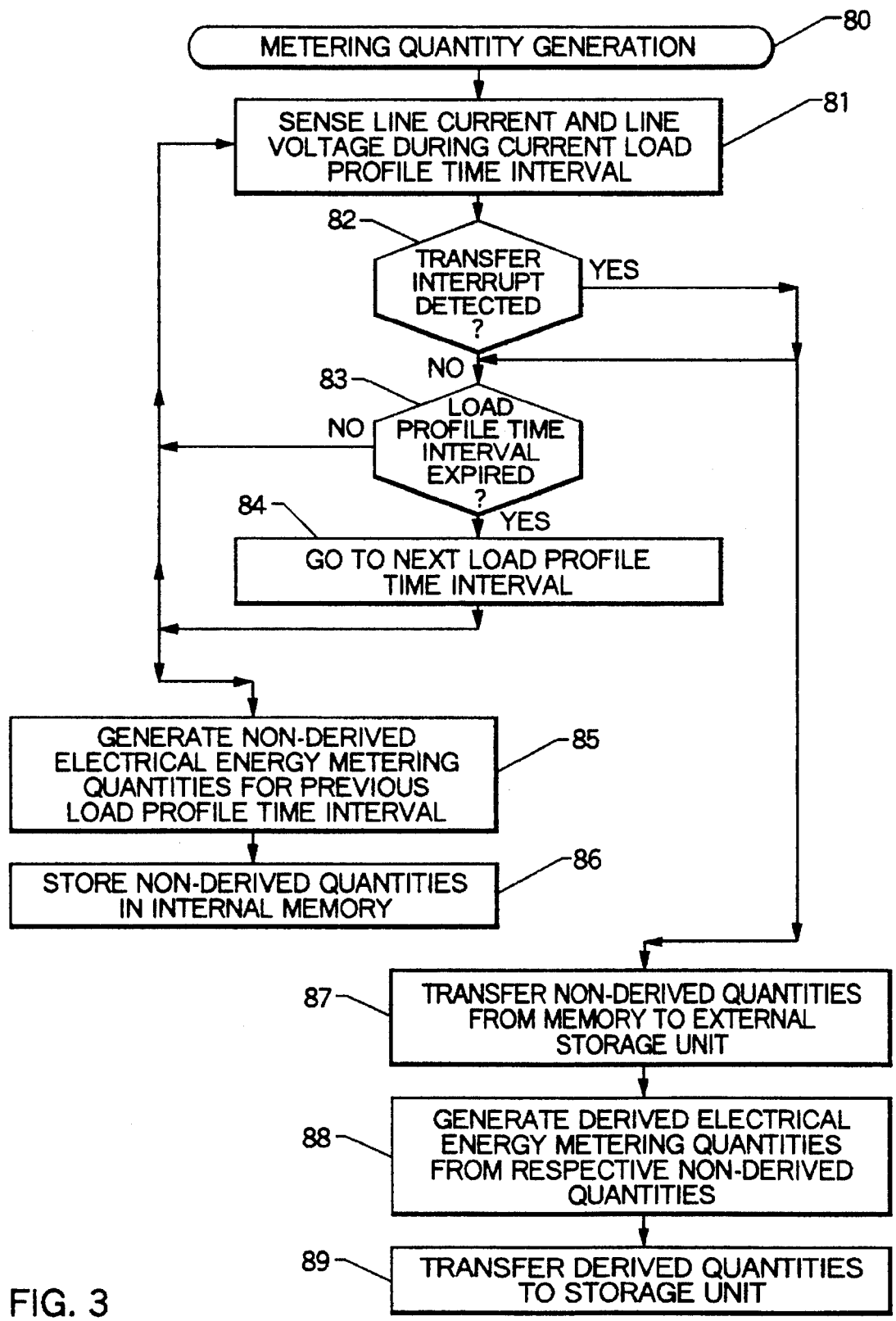
FIG. 3 is a flow-chart of steps corresponding to a preferred method of generating electrical energy metering quantities in a multi-channel load profile recorder.

Referring now to FIG. 3, a preferred method of generating electrical energy metering quantities 80 in the multi-channel load profile recorder 40, will be described. As illustrated by Block 81, the generation method 80 begins with the step of sensing a line quantity such as a line current and/or a line voltage transferred from an energy source (e.g., the power line) to an electrical load, during a load profile time interval. This time interval has a preselected length (e.g., 1–240 minutes) which can be preset by the manufacturer of the recorder 40 and/or programmed in the field by a utility operator. During the load profile time interval, a check is repeatedly performed in the "background" to determine whether a utility operator has accessed the meter 20, using the switches 47–49, and requested a transfer of a stored load profile record from the recorder to the external programming unit 70 via the serial data link 61, Block 82. If a transfer request has not been detected, no "background" action is taken by the ASIC 41 to generate metering quantities until the expiration of the current load profile time interval, Block 83. Once this occurs, the next interval automatically commences, Block 84, and then a plurality of non-derived electrical energy metering quantities (e.g., Wh, Varh, V$^2$h and I$^2$h) are also generated during the next interval, Block 85, based on the sensed line quantities from the previous time interval. Once these quantities have been generated by the microprocessor 42, they are stored in internal memory (e.g., PROM 44), Block 86. As illustrated, these steps are repeated for each of the consecutive load profile time intervals, until the meter 20 is reset (or reprogrammed) or removed from the field for servicing.

At the expiration of a sufficient number of load profile time intervals, a utility operator may request a transfer of the currently stored load profile record, which has been accumulated since the last transfer request was generated, Block 82. These requests typically occur on a monthly basis while the meter is being read in the field by the utility operator.

Alternatively, these requests may be made from the remote source using the transceiver or modem. Once a transfer request has been made, the accumulated record of non-derived quantities is downloaded from memory and transferred to an external programming unit 70, Block 87. This transfer step preferably occurs in the foreground while the time interval expiration step, Block 83, and other steps (e.g., Blocks 81, 84–86) are being performed in the background. At this time, the ASIC 41 performs operations to generate the derived electrical energy metering quantities (e.g., VAh, PF) from respective ones of the recorded non-derived quantities, and then these quantities are transferred to the external programming unit as well, Blocks 88–89. For example, the number of volt-ampere-hours (VAh) for a particular time interval can be derived by taking the square-root of the sum of the squares of the stored volt$^2$-hours (V$^2$h) and ampere$^2$-hours (I$^2$h) metering quantities. Similarly, the power factor (PF) for a particular time interval can be derived by determining a quotient which equals the non-derived watt-hours (Wh) divided by the derived volt-ampere-hours (VAh). Furthermore, although steps 87–89 are shown as sequential steps, the are preferably performed contemporaneously by the ASIC 41. This means that steps 87–89 commence at the time the meter is accessed by the utility field operator or remote source and are performed during the meter reading operations. Alternatively, the order of the steps 87–89 may be changed. For example, the derived quantities may be generated and stored in random-access memory before the non-derived quantities are transferred, so that both the non-derived and derived quantities can be transferred together.

According to another embodiment of the present invention, each load profile time interval may also include multiple subintervals during which non-derived quantities are generated and temporarily stored in memory until the end of the load profile time interval. Once this occurs, a derived quantity may then be determined from the temporarily stored quantities and then these derived quantities may then be stored in non-volatile memory and/or displayed. According to this embodiment, the time interval of FIG. 3 may be treated as a subinterval; the interrupt may be automatically generated at the end of each load profile time interval; and the storage unit may be internal memory.

Thus, a multi-channel load profile recorder according to the present invention can generate a relatively large record of both non-derived and derived channels of electrical energy metering quantities, even though internal non-volatile memory is insufficient to store the quantities for both types of channels. Periodic retrieval of the load profile record by a utility operator can also be less frequent because a greater number of load profile intervals can be recorded before the memory capacity of the recorder is reached.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of generating electrical energy metering quantities in a multi-channel load profile recorder, comprising the steps of:

sensing a line current and a line voltage transferred from a line to a load during a first load profile time interval;

generating at least one first electrical energy metering quantity based on the sensed line current and the sensed line voltage, upon completion of the first load profile time interval;

storing the first electrical energy metering quantity in a programmable memory portion of the multi-channel load profile recorder;

transferring the first electrical energy metering quantity from the programmable memory portion of the multi-channel load profile recorder to a storage unit located external to the multi-channel load profile recorder;

contemporaneously with said first electrical energy metering quantity transferring step, generating, internal to the multi-channel load profile recorder, at least one second electrical energy metering quantity corresponding to the first load profile time interval from the first electrical energy metering quantity; and then transferring the second electrical energy metering quantity from the multi-channel load profile recorder to the storage unit.

2. The method of claim 1, wherein said storing step comprises the step of storing the first electrical energy metering quantity in a programmable memory portion of the multi-channel load profile recorder during a second load profile time interval, subsequent to the first load profile time interval; and wherein said second electrical energy metering quantity generating step is performed subsequent to the second load profile time interval.

3. The method of claim 2, wherein said first electrical energy metering quantity generating step comprises the step of generating a watt-hour metering quantity for the first load profile time interval, based on the sensed line current and the sensed line voltage.

4. The method of claim 3, wherein said first electrical energy metering quantity generating step further comprises the steps of generating electrical energy metering quantities selected from the group consisting of, ampere$^2$-hour, and volt$^2$-hour, for the first load profile time interval; and wherein said storing step further comprises the step of storing the electrical energy metering quantities in the programmable memory portion of the multi-channel load profile recorder.

5. The method of claim 4, wherein said second electrical energy metering quantity generating step comprises the step of generating a volt-ampere-hour metering quantity from the stored electrical energy metering quantities.

6. The method of claim 5, wherein said second electrical energy metering quantity generating step further comprises the step of generating a power factor metering quantity from the stored electrical energy metering quantities and the volt-ampere-hour metering quantity.

7. A method of generating electrical energy metering quantities in a multi-channel load profile recorder, comprising the steps of:

sensing a line quantity transferred from a line to a load during a first load profile time interval, said line quantity selected from the group consisting of line current and line voltage;

generating a first electrical energy metering quantity based on the sensed line quantity, upon completion of the first load profile time interval;

storing the first electrical energy metering quantity in the multi-channel load profile recorder during a second load profile time interval, subsequent to the first load profile time interval;

transferring the first electrical energy metering quantity from the multi-channel load profile recorder to a storage unit located external to the multi-channel load profile recorder, subsequent to the second load profile time interval; and contemporaneously with said first electrical energy metering quantity transferring step, generating a second electrical energy metering quantity corresponding to the first load profile time interval from the first electrical energy metering quantity.

8. The method of claim 7, wherein said second electrical energy metering quantity generating step is performed subsequent to the second load profile time interval and comprises the step of generating, internal to the multi-channel load profile recorder, a second electrical energy metering quantity corresponding to the first load profile time interval, based on the first electrical energy metering quantity.

9. The method of claim 8, further comprising the step of transferring the second electrical energy metering quantity from the multi-channel load profile recorder to the storage unit.

10. The method of claim 8, wherein said first electrical energy metering quantity generating step comprises the step of generating a watt-hour metering quantity for the first load profile time interval, based on the sensed line quantity.

11. The method of claim 10, wherein said first electrical energy metering quantity generating step further comprises the steps of generating electrical energy metering quantities selected from the group consisting of ampere-hour, ampere$^2$-hour, volt-hour and volt$^2$-hour, for the first load profile time interval; and wherein said storing step further comprises the step of storing the electrical energy metering quantities in a programmable memory portion of the multi-channel load profile recorder.

12. The method of claim 11, wherein said second electrical energy metering quantity generating step comprises the step of generating a volt-ampere-hour metering quantity from the stored electrical energy metering quantities.

13. The method of claim 12, wherein said second electrical energy metering quantity generating step further comprises the step of generating a power factor metering quantity from the stored electrical energy metering quantities and the volt-ampere-hour metering quantity.

14. The method of claim 7, wherein said second electrical energy metering quantity generating step is performed subsequent to the second load profile time interval and comprises the step of generating, external to the multi-channel load profile recorder, a second electrical energy metering quantity corresponding to the first load profile time interval, based on the first electrical energy metering quantity.

15. A method of generating electrical energy metering quantities in a multi-channel load profile recorder, comprising the steps of:

sensing a line current and a line voltage transferred from a line to a load during a first load profile time interval;

generating a plurality of non-derived electrical energy metering quantities based on the sensed line current and the sensed line voltage, upon completion of the first load profile time interval;

storing the plurality of non-derived electrical energy metering quantities in a programmable memory portion of the multi-channel load profile recorder;

transferring the non-derived electrical energy metering quantities from the programmable memory portion of the multi-channel load profile recorder to a storage unit located external to the multi-channel load profile recorder;

contemporaneously with said non-derived electrical energy metering quantities transferring step, generating, internal to the multi-channel load profile recorder, a plurality of derived electrical energy metering quantities which correspond to the first load profile time interval from the non-derived electrical energy metering quantities; and then transferring the derived electrical energy metering quantities from the multi-channel load profile recorder to the storage unit without storing them in a programmable memory portion of the multi-channel load profile recorder.

16. The method of claim 15, wherein said storing step comprises the step of storing the non-derived electrical energy metering quantities in a programmable memory portion of the multi-channel load profile recorder during a second load profile time interval, subsequent to the first load profile time interval; and wherein said derived electrical energy metering quantities generating step is performed subsequent to the second load profile time interval.

17. The method of claim 16, wherein said non-derived electrical energy metering quantities generating step comprises the step of generating electrical energy metering quantities selected from the group consisting of watt-hour, var-hour, ampere$^2$-hour and volt$^2$-hour, for the first load profile time interval.

18. The method of claim 17, wherein said derived electrical energy metering quantities generating step comprises the steps of generating a volt-ampere-hour metering quantity and a power factor metering quantity from the stored non-derived electrical energy metering quantities.

* * * * *